(12) United States Patent
Kato et al.

(10) Patent No.: US 7,433,000 B2
(45) Date of Patent: Oct. 7, 2008

(54) LIGHTING SYSTEM AND DISPLAY

(75) Inventors: Yoshifumi Kato, Kariya (JP); Kazuto Noritake, Kariya (JP)

(73) Assignee: Kabushiki Kaisha Toyota Jidoshokki, Kariya-shi (JP)

( * ) Notice: Subject to any disclaimer, the term of this patent is extended or adjusted under 35 U.S.C. 154(b) by 1129 days.

(21) Appl. No.: 10/613,417

(22) Filed: Jul. 3, 2003

(65) Prior Publication Data

US 2004/0004594 A1  Jan. 8, 2004

(30) Foreign Application Priority Data

Jul. 5, 2002  (JP) .............................. 2002-197633

(51) Int. Cl.
*G02F 1/1335* (2006.01)
*H01J 1/62* (2006.01)

(52) U.S. Cl. .......................... 349/69; 313/504; 313/505

(58) Field of Classification Search ..................... 349/69
See application file for complete search history.

(56) References Cited

U.S. PATENT DOCUMENTS 5,798,610 A   8/1998  Koenck et al. .............. 313/498
6,025,894 A * 2/2000  Shirasaki et al. ............. 349/69
6,091,384 A * 7/2000  Kubota et al. ................. 345/76
6,947,105 B2* 9/2005  Miyatake et al. ............. 349/69

FOREIGN PATENT DOCUMENTS

| EP | 1 081 767 A2 | 3/2001 |
|----|----|----|
| JP | 10-078582 | 3/1998 |
| JP | 10-189237 | 7/1998 |
| JP | 10-189243 | 7/1998 |
| JP | 10-189251 | 7/1998 |
| JP | 2001-4998 | 1/2001 |
| JP | 2001-288416 | 10/2001 |
| JP | 2001-350005 | 12/2001 |
| JP | 2002-6776 | 1/2002 |
| JP | 2002-198167 | 7/2002 |
| WO | WO 94/21094 | 9/1994 |

* cited by examiner

*Primary Examiner*—Michael H Caley
(74) *Attorney, Agent, or Firm*—Morgan & Finnegan, LLP

(57) ABSTRACT

A lighting system and a display are capable of efficiently using light emitted by a light emitting element. The lighting system and the display according to the present invention include prisms located in an electroluminescent layer, which functions as the light emitting element. Each prism reflects or refracts light incident to the prism such that light emitted by the electroluminescent layer reaches an interface between the electroluminescent layer and a transparent electrode at an angle that is less than the critical angle at the interface.

11 Claims, 4 Drawing Sheets

LIGHTING SYSTEM AND DISPLAY

BACKGROUND OF THE INVENTION

The present invention relates to a lighting system and a display.

As disclosed in Japanese Laid-Open Patent Publication No. 10-78582, a typical lighting system having light emitting elements is used as a backlight in a liquid crystal display. A liquid crystal display 50 shown in FIG. 8 includes a lighting panel 52 and a liquid crystal panel 51. The liquid crystal panel 51 shows an image using light from the lighting panel 52. The lighting panel 52 is formed by laminating a cathode 54, an electroluminescent layer 55, and an anode 56 in this order on a substrate 53. The cathode 54 is reflective. The electroluminescent layer 55 functions as a light emitting element. The anode 56 is transmissive.

Figure 8:
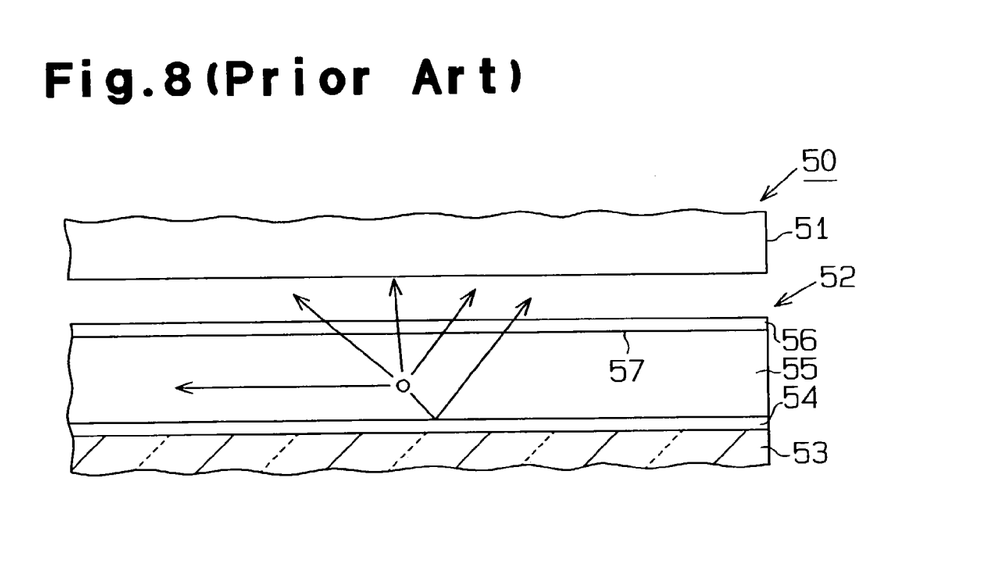
FIG. 8 is a cross-sectional view illustrating a prior art liquid crystal display.

In low light, the liquid crystal display 50 shows an image using light emitted by the electroluminescent layer 55. Light emitted by the electroluminescent layer 55 passes through the interface 57 between the electroluminescent layer 55 and the anode 56 and exits from a light outputting surface of the lighting panel 52 that faces the liquid crystal panel 51. In bright light, the liquid crystal display 50 shows an image using outside light. Outside light that enters the lighting panel 52 through the light outputting surface is reflected by the cathode 54. The reflected outside light passes through the interface 57 and exits from the light outputting surface.

Light emitted by the electroluminescent layer 55 is irradiated in all directions. That is, the light is not only irradiated toward the cathode 54 and the anode 56, but also irradiated in a direction parallel to the interface 57.

Light irradiated in a direction parallel to the interface 57 is converted into thermal energy while being propagated through the electroluminescent layer 55 or leaks from portions of the lighting panel 52 other than the light outputting surface. As a result, the light does not pass through the interface 57. Also, light that has a great incident angle relative to the interface 57 does not pass through but is totally reflected by the interface 57. The reflected light is converted into thermal energy while being propagated through the electroluminescent layer 55 or leaks from portions of the lighting panel 52 other than the light outputting surface.

In this manner, part of the light emitted by the electroluminescent layer 55 does not exit from the light outputting surface. In other words, part of the light emitted by the electroluminescent layer 55 is not used for showing an image and is wasted.

SUMMARY OF THE INVENTION

Accordingly, it is an objective of the present invention to provide a lighting system and a display that efficiently use light emitted by a light emitting element.

To achieve the foregoing and other objectives and in accordance with the purpose of the present invention, a lighting system having a light emitting element and a direction shifting element is provided. The light emitting element is located between a reflective element and an output element. The reflective element reflects light incident to the reflective element. The output element outputs light emitted by the light emitting element. The direction shifting element is located between the reflective element and the output element. The direction shifting element reflects or refracts light incident to the direction shifting element, thereby shifting the direction of light incident to the direction shifting element.

The present invention also provides a lighting unit and a display unit. The lighting unit includes a light emitting element and a direction shifting element. The light emitting element is located between a reflective element and an output element. The reflective element reflects light incident to the reflective element. The output element outputs light emitted by the light emitting element. The direction shifting element located between the reflective element and the output element. The direction shifting element reflects or refracts light incident to the direction shifting element, thereby shifting the direction of light incident to the direction shifting element. The display unit is located on or above the output element. The display unit displays an image by using light outputted from the output element.

In another aspect of the present invention, a display including a plurality of first electrodes, a plurality of second electrodes, a plurality of light emitting elements, and a direction shifting element is provided. The first electrodes extend parallel to each other and are generally located in a plane. The second electrodes extend in a direction perpendicular to the first electrodes and are generally located in a plane. Each light emitting element is located between one of the first electrodes and one of the second electrodes. The light emitting element emits light when a voltage is applied to the corresponding first and second electrodes. The direction shifting element is located between the plane of first electrodes and the plane of second electrodes. The direction shifting element reflects or refracts light incident to the direction shifting element, thereby shifting the direction of light incident to the direction shifting element.

Other aspects and advantages of the invention will become apparent from the following description, taken in conjunction with the accompanying drawings, illustrating by way of example the principles of the invention.

BRIEF DESCRIPTION OF THE DRAWINGS

The invention, together with objects and advantages thereof, may best be understood by reference to the following description of the presently preferred embodiments together with the accompanying drawings in which.

DETAILED DESCRIPTION OF THE PREFERRED EMBODIMENTS

A first embodiment of the present invention will now be described with reference to FIGS. 1 to 3.

Figure 1:
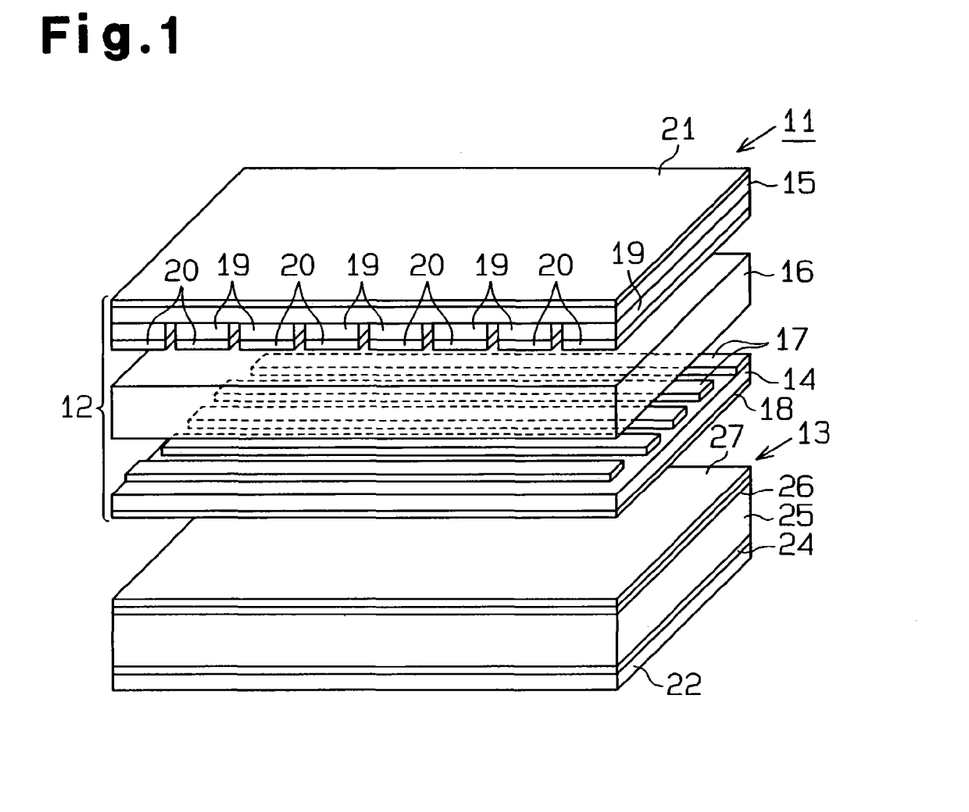
FIG. 1 is a schematic exploded perspective view showing a section of the display according to a first embodiment of the present invention.

As shown in FIG. 1, a display 11 includes a display unit, which is a transmissive liquid crystal panel 12 in this embodiment, and a lighting unit, which is a backlight panel 13 in this embodiment.

The liquid crystal panel 12 includes liquid crystal elements, which are driven by a passive matrix system. The surface of the liquid crystal panel 12 that is facing away from the backlight panel 13 functions as a screen for displaying an image. The liquid crystal panel 12 has a pair of transparent substrates 14, 15, a liquid crystal 16, scanning electrodes 17, color filters 19, transparent electrodes 20, and a pair of polarizing plates 18, 21.

The substrates 14, 15 are of a light transmittance type and can be made of glass. The substrate 14 is closer to the backlight panel 13 than the substrate 15 is. The peripheral portions of the substrates 14, 15 are bonded together with a sealing material (not shown).

The liquid crystal 16 is located between the substrates 14 and 15. The scanning electrodes 17 are located on a surface of the substrate 14 that faces the liquid crystal 16. The scanning electrodes 17 extend parallel to each other. The scanning electrodes 17 are of a light transmittance type and can be made of indium tin oxide. The polarizing plate 18 is located on a surface of the substrate 14 that is facing away from the liquid crystal 16.

The color filters 19 are located on a surface of the substrate 15 that faces the liquid crystal 16. The color filters 19 extend parallel to each other and perpendicular to a direction in which the scanning electrodes 17 extend. The color filters 19 include red filters that convert white light to red light, green filters that convert white light to green light, and blue filters that convert white light to blue light. Each transparent electrode 20 is located on a surface of the corresponding color filter 19 that faces the liquid crystal 16. The transparent electrodes 20 extend parallel to each other and perpendicular to a direction in which the scanning electrodes 17 extend. The transparent electrodes 20 can be made of indium tin oxide. The polarizing plate 21 is located on a surface of the substrate 15 that is facing away from the liquid crystal 16.

Portions of the liquid crystal 16 located between the scanning electrodes 17 and the transparent electrodes 20, in other words, portions of the liquid crystal 16 corresponding to intersections between the scanning electrodes 17 and the transparent electrodes 20, function as the liquid crystal elements. The liquid crystal elements are arranged in a matrix. A pixel includes one of the liquid crystal elements corresponding to the red filter, one of the liquid crystal elements corresponding to the green filter, and one of the liquid crystal elements corresponding to the blue filter.

The arrangement of liquid crystal molecules of each liquid crystal element reversibly varies in accordance with an electric field that is applied to the liquid crystal element. That is, the arrangement of the liquid crystal molecules of each liquid crystal element varies to prevent light from being transmitted when the electric field that is applied to the liquid crystal element is greater than or equal to a predetermined value, and varies to permit light to be transmitted when the electric field that is applied to the liquid crystal element is less than the predetermined value. Each liquid crystal element is exposed to an electric field when voltage is applied to the corresponding scanning electrode 17 and the corresponding transparent electrode 20 by a drive apparatus, which is not shown.

The backlight panel 13 is located at the rear of the liquid crystal panel 12. The backlight panel 13 includes an electroluminescent element, which functions as a light emitting element. The backlight panel 13 has a substrate 22, a first electrode 24, an electroluminescent layer 25, a second electrode 26, and a passivation film 27. The surface of the backlight panel 13 that faces the liquid crystal panel 12 functions as a light outputting surface, or an output element from which light exits.

The substrate 22 can be made of glass. The first electrode 24 is located on a surface of the substrate that faces the liquid crystal panel 12. The first electrode 24 has light reflectivity and can be made of metal, such as aluminum. The first electrode 24 functions as an anode. The electroluminescent layer 25 is located on a surface of the first electrode 24 that faces the liquid crystal panel 12. The second electrode 26 is located on a surface of the electroluminescent layer 25 that faces the liquid crystal panel 12. The second electrode 26 is of a light transmittance type and can be made of indium tin oxide. The second electrode 26 functions as a cathode. The passivation film 27 is located on the sides of the first electrode 24, the electroluminescent layer 25, and the second electrode 26 and on a surface of the second electrode 26 that faces the liquid crystal panel 12. The passivation film 27 is of a light transmittance type and can be made of silicon nitride or silicon oxide. The passivation film 27 prevents transmittance of water and oxygen, thereby sealing the electroluminescent layer 25.

The first electrode 24 entirely covers a surface of the electroluminescent layer 25 that faces away from the liquid crystal panel 12. The second electrode 26 entirely covers a surface of the electroluminescent layer 25 that faces the liquid crystal panel 12.

The electroluminescent layer 25 includes an organic electroluminescent material and functions as the electroluminescent element. The electroluminescent layer 25 has, for example, a hole injection layer, an illuminating layer, and an electron injection layer. Those layers are arranged in this order from the side facing the first electrode 24 toward the second electrode 26. When exposed to an electric field that is greater than a predetermined value, the electroluminescent layer 25 emits white light. The electroluminescent layer 25 is exposed to an electric field when voltage is applied to the first electrode 24 and the second electrode 26 by a drive apparatus, which is not shown.

Figure 2:
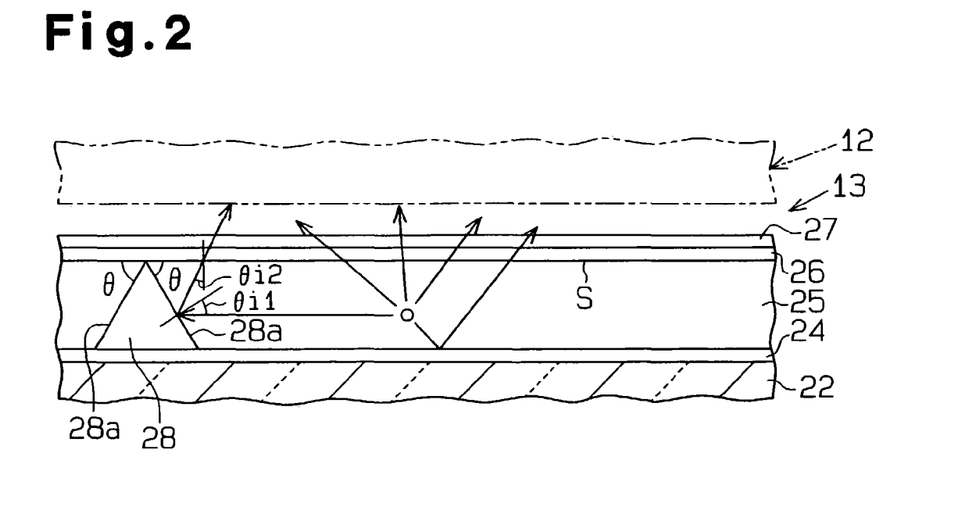
FIG. 2 is a cross-sectional view showing the backlight panel of the display shown in FIG. 1.
Figure 3:
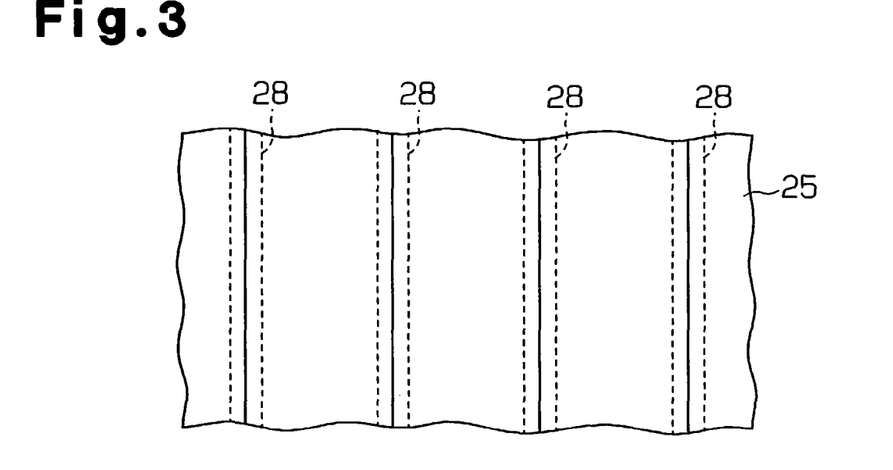
FIG. 3 is a plan view showing a part of the backlight panel shown in FIG. 2.

As shown in FIGS. 2 and 3, the electroluminescent layer 25 includes prisms 28, which function as direction shifting elements. The prisms 28 are of a light transmittance type and can be made of an ultraviolet curing acrylic resin. The prisms 28 have a refractive index that is less than that of the electroluminescent layer 25. In this embodiment, the refractive index of the electroluminescent layer 25 is 1.8, and the refractive index of the prisms 28 is 1.5. The prisms 28 are each shaped like a thin triangular pole and extend parallel to each other in the electroluminescent layer 25. First interfaces 28a, each of which is the interface between the electroluminescent layer 25 and one of the prisms 28, are defined by the first electrode 24 and the second electrode 26.

When light is propagated from a medium having a greater refractive index to a medium having a smaller refractive index, the light is totally reflected by the interface between the media if the incident angle of the light to the interface exceeds a certain angle, or a critical angle. If the incident angle is less than the critical angle, the light passes through the interface and is refracted. Given that the refractive index of the medium having the greater refractive index is referred to $n1$, the refractive index of the medium having the smaller refractive index is referred to n2, and the critical angle is referred to θc, the following equation is satisfied.

$$\sin \theta c = n2/n1$$

Since the refractive index of the electroluminescent layer 25 is 1.8, and the refractive index of the prisms 28 is 1.5, the critical angle is 56.4 degrees on the first interface 28a when light is propagated from the electroluminescent layer 25 to the prisms 28.

An interface between the electroluminescent layer 25 and the second electrode 26 is referred to as a second interface S. The angle θ defined by the first interface 28a and the second interface S is determined so that light that is totally reflected by the first interface 28a toward the second interface S reaches the second interface S at an angle that is less than the critical angle of the second interface S. In this embodiment, the angle θ is 33 degrees. For convenience of illustration, the angle θ in FIG. 2 is different from the actual angle.

The backlight panel 13 is manufactured by forming the first electrode 24 on the substrate 22 through vacuum deposition. Then, to form a resin layer on the first electrode 24, an ultraviolet curing acrylic resin is applied to the first electrode 24. Some parts of the resin layer are masked, and ultraviolet rays are irradiated onto portions of the resin layer that are not masked. This hardens the portions that are not masked. The hardened portions are the prisms 28. Subsequently, the parts of the resin layer that have not been hardened are removed. The electroluminescent layer 25 is formed through deposition on portions of the first electrode 24 on which no prisms 28 are formed. Thereafter, the second electrode 26 is formed on the electroluminescent layer 25 through sputtering. Finally, the passivation film 27 is formed on the second electrode 26.

An operation of the display 11 will now be described.

When electricity is supplied to the backlight panel 13, voltage is applied to the first electrode 24 and the second electrode 26, which causes the electroluminescent layer 25 to emit white light. The emitted light exits from the light outputting surface through the second interface S and is irradiated onto the liquid crystal panel 12. Light that is irradiated onto portions of the liquid crystal panel 12 that correspond to liquid crystal elements permitting transmission of light passes through the liquid crystal 16. The passed through light is then converted into red light, green light, or blue light by the color filters 19. As a result, an image is shown on the screen of the liquid crystal panel 12.

This embodiment provides the following advantages.

Light that is propagated from the electroluminescent layer 25 to the prisms 28 is reflected or refracted depending on the incident angle to the first interface 28a. Accordingly, the amount of light that is lost without being propagated from the electroluminescent layer 25 to the second electrode 26 is reduced. This is because light reflected by the second interface S when propagated from the electroluminescent layer 25 to the second electrode 26 is reflected or refracted by the first interface 28a, and the light then reaches the second interface S again at an incident angle different from the incident angle of the previous entry. In many cases, light incident to the second interface S at an incident angle different from the incident angle of the previous entry is not reflected but passes through the second interface S.

The angle θ defined by the first interface 28a and the second interface S is determined so that light that is totally reflected by the first interface 28a toward the second interface S reaches the second interface S at an angle that is less than the critical angle of the second interface S. Therefore, light that is totally reflected by the first interface 28a toward the second interface S passes through the second interface S and exits from the light outputting surface.

The angle θ defined by each first interface 28a and the second interface S is 33 degrees. Therefore, when a light that is parallel to the second interface S is propagated from the electroluminescent layer 25 to each prism 28, the incident angle θi1 (see FIG. 2) of the light to the first interface 28a is 57 degrees, which is greater than 56.4 degrees, which is the critical angle. Thus, the light that is parallel to the second interface S is totally reflected by the first interface 28a and travels toward the light outputting surface. Accordingly, light that is irradiated in a direction parallel to the second interface S exits from the light outputting surface. When totally reflected light is propagated from the electroluminescent layer 25 to the second electrode 26, the incident angle θi2 (see FIG. 2) of the light to the second interface S is 24 degrees. The incident angle θi2 is less than the critical angle to the second interface S when light is propagated from the electroluminescent layer 25 to the second electrode 26. For convenience of illustration, the incident angles θi1 and θi2 in FIG. 2 are different from the actual angles.

Compared to a direction shifting element that has a specular surface and reflects light on the specular surface, the prisms 28 are easy to manufacture.

The refractive index of each prism 28 is less than that of the electroluminescent layer 25. Therefore, each prism 28 totally reflects light that is propagated from the electroluminescent layer 25 to the prism 28 at the first interface 28a.

Compared to a spherical direction shifting element, the prisms 28, which are triangular poles, are easy to manufacture.

Compared to a square pole shaped prism, the triangular pole shaped prisms 28 have advantages for enlarging the electroluminescent layer 25.

The prisms 28 are made of an ultraviolet curing acrylic resin. Therefore, the prisms 28 are easily formed on desired portions of the first electrode 24. Also, ultraviolet curing acrylic resins are easy to obtain.

The electroluminescent layer 25 is closer to the light outputting surface than the substrate 22 is. Compared to a case where the substrate 22 is closer to the light outputting surface than the electroluminescent layer 25 is, it is easy to manufacture the prisms 28 so that light reflected by the first interface 28a travels directly to the second interface S.

The first electrode 24 reflects light that is emitted by the electroluminescent layer 25 to the first electrode 24 toward the second interface S. Therefore, light that is emitted toward the first electrode 24 exits from the light outputting surface.

Light that is emitted from the electroluminescent layer 25 is white light. In this case, compared to a case where the electroluminescent layer 25 is replaced by an electroluminescent layer that emits light other than white light, such as blue light, the structure of the color filters 19 is simplified.

A second embodiment of the present invention will now be described with reference to FIGS. 4A and 4B. Similar or the same reference numerals are given to those components that are like or the same as the corresponding components of the display 11 shown in FIG. 1.

Figure 4A:
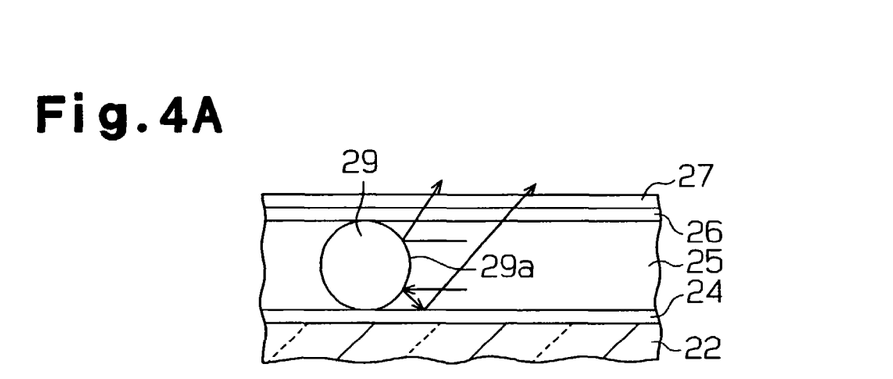
FIG. 4A is a cross-sectional view showing a backlight panel of a display according to a second embodiment.
Figure 4B:
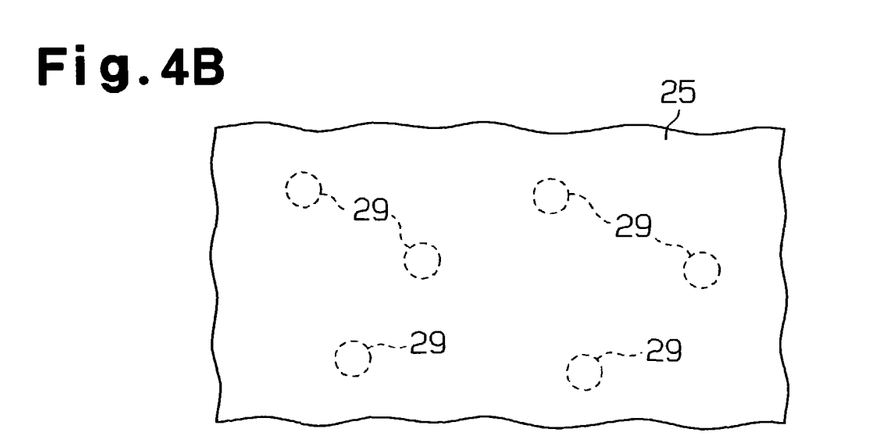
FIG. 4B is a plan view showing a part of the backlight panel shown in FIG. 4A.

As shown in FIGS. 4A and 4B, a backlight of a display according to the second embodiment has beads 29 instead of the prisms 28. The beads 29 function as direction shifting elements. The beads 29 are spherical and made of acrylic resin. The beads 29 are dispersed in the electroluminescent layer 25. As shown in FIG. 4A, the diameter of each bead 29 is the same as the thickness of the electroluminescent layer 25.

The electroluminescent layer 25 of the second embodiment has a red light emitting layer, a blue light emitting layer, and a green light emitting layer. The red light emitting layer is formed of a composition disclosed in Japanese Laid-Open Patent Publication No. 2001-288416, which component is made by dissolving polyoctylfluorene and perylene pigment in xylene and 1,2,4,5-tetramethylbenzene. The blue light emitting layer is formed of another composition disclosed in the same publication, which component is made by dissolving polyoctylfluorene in 1,2,3,4-tetramethylbenzene.

The beads 29 are dispersed in compositions for forming the light emitting layers in advance. The electroluminescent layer 25 is formed by consecutively applying the compositions, in which the beads 29 are dispersed, on the first electrode 24.

The second embodiment provides the following advantages.

Light that is propagated from the electroluminescent layer 25 to each bead 29 is reflected or refracted by an interface 29a between the electroluminescent layer 25 and the bead 29 depending on the incident angle relative to the interface 29a. Accordingly, as in the first embodiment, the amount of light that is lost without being propagated from the electroluminescent layer 25 to the second electrode 26 is reduced.

The beads 29 are dispersed in the electroluminescent layer 25. Therefore, the amount of light at any given two portions on the light outputting surface are relatively uniform.

The beads 29 are spherical. Therefore, the orientation of each bead 29 in the electroluminescent layer 25 need not be taken in to consideration.

It should be apparent to those skilled in the art that the present invention may be embodied in many other specific forms without departing from the spirit or scope of the invention. Particularly, it should be understood that the invention may be embodied in the following forms.

Figure 5A:
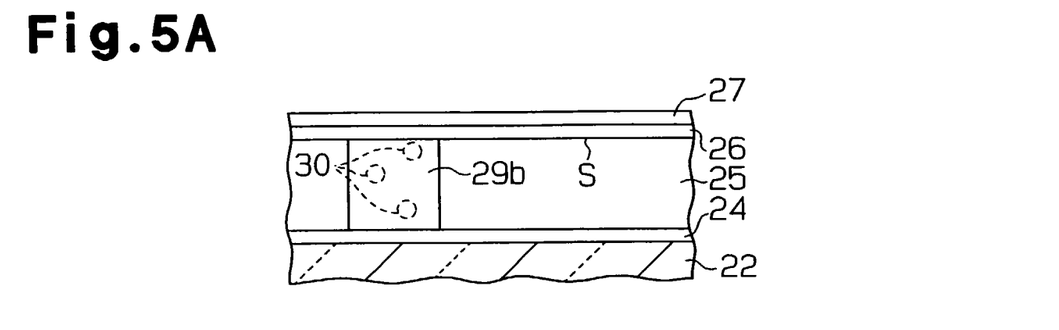
FIG. 5A is a cross-sectional view showing a part of a backlight panel according to a modified embodiment.

The prisms 28, one of which is shown in FIG. 2, and the beads 29, one of which is shown in FIG. 4A, may be replaced by transparent members 29b containing bubbles 30 shown in FIG. 5A. The transparent members 29b can be made of acrylic resin or glass. The bubbles 30 can be made of nitrogen gas. In this case, light that is emitted in a direction parallel to the second interface S is reflected and refracted not by the interfaces between the electroluminescent layer 25 and the transparent members 29b, but by the interfaces between the transparent members 29b and the bubbles 30.

Figure 5B:
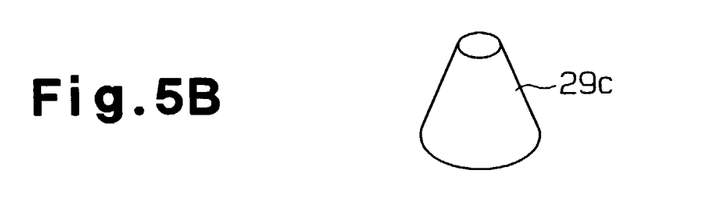
FIG. 5B is a perspective view showing a direction shifting element according to another modified embodiment.

The beads 29, one of which is shown in FIG. 4A, may be replaced by truncated cones 29c, one of which is shown in FIG. 5B. Alternatively, the beads 29 may be replaced by cone-shaped, pyramid-shaped, truncated pyramid shaped, or hemispherical direction shifting elements. These direction shifting elements are preferably located in the electroluminescent layer 25 such that the bases are closer to the first electrode 24.

The beads 29, one of which is shown in FIG. 4A, may be replaced by rugby ball shaped direction shifting elements. In this case, the orientation of each shifting element in the electroluminescent layer 25 need not be taken in to consideration.

Figure 5C:
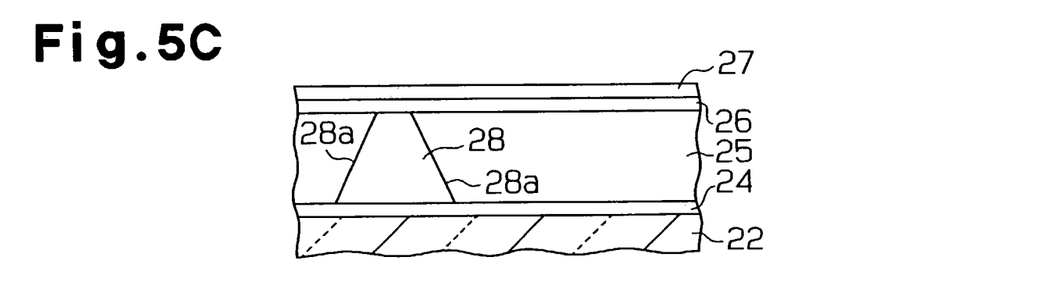
FIG. 5C is a cross-sectional view showing a part of a backlight panel according to a further modified embodiment.

The prisms 28, one of which is shown in FIG. 2, may be replaced by prisms 28 shown in FIG. 5C, which are square pole shaped and have trapezoidal cross-section.

The prisms 28 need not be parallel to each other but may be arranged in a lattice. In this case, the amount of light at any given two portions on the light outputting surface are relatively uniform.

The prisms 28 may be replaced by a frame located at the peripheral portion of the electroluminescent layer 25. In this case, when applying composition for forming the electroluminescent layer 25, the composition is easily applied to desired portions on the first electrode 24.

The prisms 28, one of which is shown in FIG. 2, and the beads 29, one of which is shown in FIG. 4A, may be both located in the electroluminescent layer 25. For example, the prisms 28 may be located in the peripheral portions of the electroluminescent layer 25 to form a frame, and the beads 29 may be located in regions other than the peripheral portions of the electroluminescent layer 25.

Figure 6:
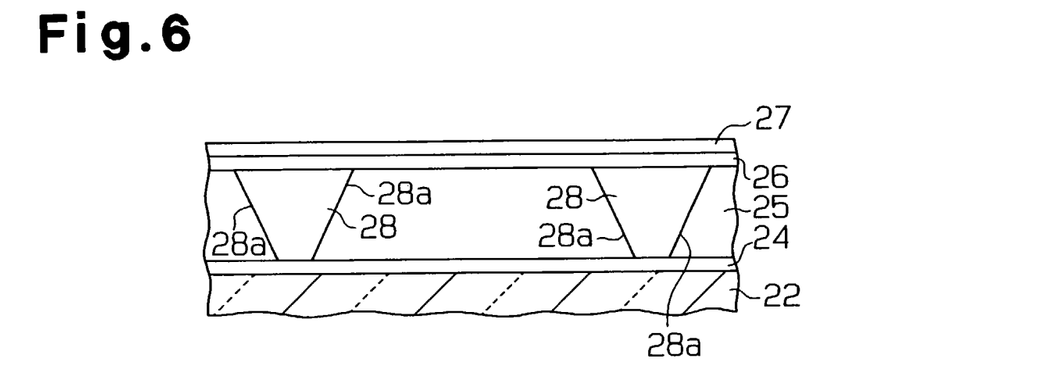
FIG. 6 is a cross-sectional view showing a part of a backlight panel according to another modified embodiment.

The substrate 22 may be located closer to the light outputting surface than the electroluminescent layer 25 is. In this case, the second electrode 26 is made of a light reflecting material such as aluminum, and the first electrode 24 is made of translucent material such as indium tin oxide. As shown in FIG. 6, the prisms 28 are preferably inverted compared to the case of the first embodiment.

The prisms 28 shown in FIG. 6 may be replaced by other direction shifting elements such as beads 29.

The prisms 28, one of which is shown in FIG. 2, and the beads 29, one of which is shown in FIG. 4A, may be replaced by direction shifting elements each having a specular surface and reflects light at the specular surface. In this case, light that is propagated from the electroluminescent layer 25 to the direction shifting elements is totally reflected by the specular surfaces of the elements.

The first electrode 24 need not be made of aluminum but may be made of other metal such as chromium. The chromium first electrode 24 has higher reflectivity than the first electrode made of aluminum.

The first electrode 24 may be replaced by a first electrode that has light transmittance type electrode portion and a light reflective film located on the electrode portion.

The prisms 28, one of which is shown in FIG. 2, and the beads 29, one of which is shown in FIG. 4A, need not contact both of the first electrode 24 and the second electrode 26. That is, the prisms 28 and the beads 29 may be provided in the electroluminescent layer 25 such that the prisms 28 and the beads 29 do not contact one or both of the first and second electrodes 24, 26.

The beads 29, one of which is shown in FIG. 4A, may be replaced by bubbles. The bubbles are formed when applying a composition for forming the electroluminescent layer 25. For example, the bubbles are formed by blowing inert gas such as nitrogen or helium into the composition or by adding foaming agent to the composition. The refractive index of inert gas such as nitrogen is small and approximately 1.00. Therefore, the critical angle on the interface between the electroluminescent layer 25 and the bubbles is small when light is propagated from the electroluminescent layer 25 to the bubble.

The electroluminescent layer 25 may be replaced by an electroluminescent layer that emits light other than white light.

The passivation film 27 need not be formed on a surface of the second electrode 26 that faces the liquid crystal panel 12. Instead, the passivation film 27 may be formed to cover only the peripheral portion of the electroluminescent layer 25.

The passivation film 27 may be replaced by a metal cover member.

The substrate 22 may be transparent or opaque.

The first electrode 24 may function as a cathode, and the second electrode 26 may function as an anode.

The present invention may be applied to a lighting system other than the backlight panel 13. In this case, in addition to the first electrode 24, the electroluminescent layer 25, and the second electrode on one side of the substrate 22, another set of the first electrode 24, the electroluminescent layer 25, and the second electrode 26 may be provided on the other side of the substrate 22. A surface of the substrate 22 on which the first electrode 24 is provided need not be flat but may be curved.

The liquid crystal panel 12 may be replaced by a liquid crystal panel including liquid crystal elements, which are driven by an active matrix system.

The liquid crystal panel 12 may be replaced by a semitransparent liquid crystal panel.

Figure 7:
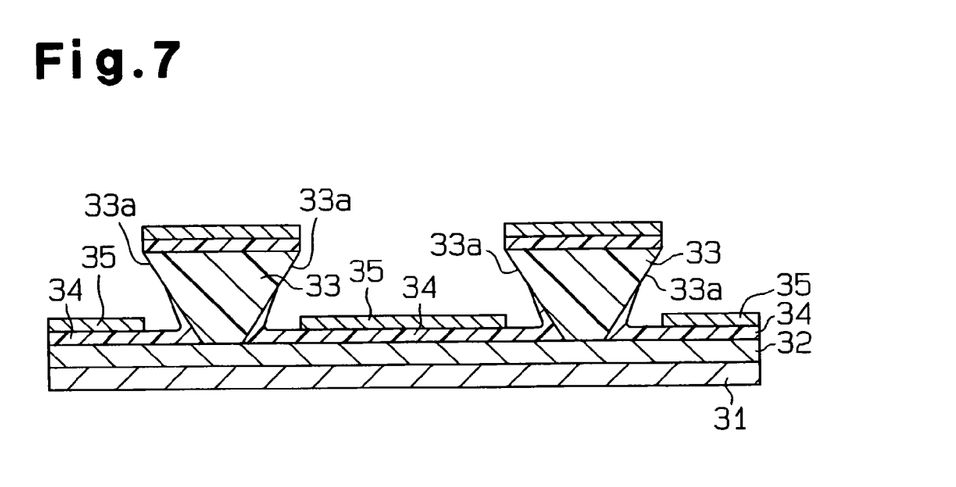
FIG. 7 is a cross-sectional view showing a part of a display according to another modified embodiment.

The present invention may be applied to a display shown in FIG. 7. The display of FIG. 7 has organic electroluminescent elements, which are driven by passive matrix system. Each organic electroluminescent element functions as a pixel or a sub-pixel. The display of FIG. 7 includes a substrate 31, first electrodes 32, partitions 33, an electroluminescent layer 34, and second electrodes 35.

The first electrodes 32 are located on the substrate 31 and extend parallel to each other. The partitions 33 are located on the substrate 31 and extend perpendicular to the first electrodes 32. The electroluminescent layer 34 is provided on portions of the substrate where the partitions 33 are not located. The second electrodes 35 are located on the electroluminescent layer 34 and extend perpendicular to the first electrodes 32.

The partitions 33 can be made of acrylic resin. Each partition 33 insulates an adjacent pair of the second electrodes 35. Two sides 33a of each partition 33 approach each other toward the substrate 31. Portions of the electroluminescent layer 34 that correspond to the intersections between the first electrodes 32 and the second electrodes 35 function as the organic electroluminescent elements.

In this case, light that is propagated from the electroluminescent layer 34 to the partitions 33 is reflected or refracted depending on the incident angle to the sides 33a. Accordingly, the amount of light that is lost without being propagated from the electroluminescent layer 34 to the second electrodes 35 is reduced.

The present examples and embodiments are to be considered as illustrative and not restrictive and the invention is not to be limited to the details given herein, but may be modified within the scope and equivalence of the appended claims.

The invention claimed is:

1. A lighting system, comprising:
a first electrode having light reflectivity;
a second electrode of a light transmittance type;
an electroluminescent layer located between the first and second electrodes, the electroluminescent layer including an organic electroluminescent material; and
a direction shifting element located within the electroluminescent layer, wherein the direction shifting element reflects or refracts light incident to the direction shifting element so that light emitted by the electroluminescent layer reaches an interface between the electroluminescent layer and the second electrode at an angle that is less than the critical angle at the interface.

2. The lighting system according to claim 1, wherein the direction shifting element has a refractive index different from that of the electroluminescent layer.

3. The lighting system according to claim 2, wherein the refractive index of the direction shifting element is less than the refractive index of the electroluminescent layer.

4. The lighting system according to claim 1, wherein the direction shifting element is a prism.

5. The lighting system according to claim 1, wherein the direction shifting element includes a plurality of particles.

6. The lighting system according to claim 5, wherein the particles are dispersed.

7. The lighting system according to claim 1, wherein the surface of the direction shifting element is specular, and wherein the direction shifting element reflects light incident to the direction shifting element.

8. The lighting system according to claim 1, further comprising a substrate on which the first and second electrodes and the electroluminescent layer, wherein the first electrode is located more closely to the substrate than the second electrode is.

9. A display, comprising:
a lighting unit, wherein the lighting unit includes:
a first electrode having light reflectivity;
a second electrode of a light transmittance type;
an electroluminescent layer located between the first and second electrodes, the electroluminescent layer including an organic electroluminescent material;
a direction shifting element located within the electroluminescent layer, wherein the direction shifting element reflects or refracts light incident to the direction shifting element so that light emitted by the electroluminescent layer reaches an interface between the electroluminescent layer and the second electrode at an angle that is less than the critical angle at the interface; and
a display unit located on or above the second electrode, wherein the display unit displays an image by using light outputted from the lighting unit.

10. The display according to claim 9, wherein the display unit includes a plurality of liquid crystal elements.

11. A display, comprising:
a plurality of first electrodes, which extend parallel to each other and are generally located in a plane, wherein the first electrodes have light reflectivity;
a plurality of second electrodes, which extend in a direction perpendicular to the first electrodes and are generally located in a plane, wherein the second electrodes are of a light transmittance type;
an electroluminescent layer located between the first electrodes and the second electrodes, the electroluminescent layer including an organic electroluminescent material, wherein the electroluminescent layer emits light when a voltage is applied to the first and second electrodes; and
a direction shifting element located within the electroluminescent layer, wherein the direction shifting element reflects or refracts light incident to the direction shifting element so that light emitted by the electroluminescent layer reaches an interface between the electroluminescent layer and the second electrode at an angle that is less than the critical angle at the interface.

* * * * *

UNITED STATES PATENT AND TRADEMARK OFFICE
CERTIFICATE OF CORRECTION

PATENT NO. : 7,433,000 B2
APPLICATION NO. : 10/613417
DATED : October 7, 2008
INVENTOR(S) : Yoshifumi Kato et al.

It is certified that error appears in the above-identified patent and that said Letters Patent is hereby corrected as shown below:

Column 2, lines 7-8, please delete "The direction shifting element located between" and insert therefore -- The direction shifting element is located between --;

Column 4, line 66, please delete "the greater refractive index is referred to n1," and insert therefore -- the greater refractive index is referred to as n1, --;

Column 5, lines 1-2, please delete "is referred to n2, and the critical angle is referred to θc, the following equation is satisfied." and insert therefore -- is referred to as n2, and the critical angle is referred to as θc, the following equation is satisfied: --;

Column 6, lines 32-33, please delete "compared to a square pole shaped prism, the triangular pole shaped prisms 28" and insert therefore -- compared to a square pole-shaped prism, the triangular pole-shaped prisms 28 --;

Column 6, lines 56-57, please delete "components that are like or the same as" and insert therefore -- components that are alike or the same as --;

Column 7, line 26, please delete "on the light outputting surface are relatively uniform." and insert therefore -- on the light outputting surface is relatively uniform. --;

Column 7, line 34, please delete "may be embodied in the following forms." and insert therefore -- may be embodied in the forms described below. --;

Column 7, line 48, please delete "truncated pyramid shaped," and insert therefore -- truncated pyramid-shaped, --;

Column 7, line 54, please delete "rugby ball shaped." and insert therefore -- rugby ball-shaped. --;

UNITED STATES PATENT AND TRADEMARK OFFICE
CERTIFICATE OF CORRECTION

PATENT NO. : 7,433,000 B2
APPLICATION NO. : 10/613417
DATED : October 7, 2008
INVENTOR(S) : Yoshifumi Kato et al.

It is certified that error appears in the above-identified patent and that said Letters Patent is hereby corrected as shown below:

Column 7, lines 58-59, please delete "which are square pole shaped" and insert therefore -- which are square pole-shaped --; and Column 7, lines 62-63, please delete "light outputting surface are relatively uniform." and insert therefore -- light outputting surface is relatively uniform. --;

Signed and Sealed this

Fourth Day of August, 2009

JOHN DOLL
*Acting Director of the United States Patent and Trademark Office*